(12) United States Patent
Liao et al.

(10) Patent No.: US 11,810,500 B2
(45) Date of Patent: Nov. 7, 2023

(54) MICRO LIGHT-EMITTING DIODE DISPLAY PANEL AND PIXEL DRIVING CIRCUIT THEREOF

(71) Applicant: PlayNitride Display Co., Ltd., Miaoli County (TW)

(72) Inventors: Kuan-Yung Liao, Miaoli County (TW); Yi-Ching Chen, Miaoli County (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 0 days.

(21) Appl. No.: 17/850,432

(22) Filed: Jun. 27, 2022

(65) Prior Publication Data

US 2022/0415247 A1 Dec. 29, 2022

Related U.S. Application Data

(60) Provisional application No. 63/215,996, filed on Jun. 29, 2021.

(51) Int. Cl.
*G09G 3/32* (2016.01)
*H01L 27/15* (2006.01)

(52) U.S. Cl.
CPC .............. *G09G 3/32* (2013.01); *H01L 27/156* (2013.01); *G09G 2320/0233* (2013.01)

(58) Field of Classification Search
CPC .............. G09G 3/32; G09G 2300/0804; G09G 2320/0233; G09G 2300/0842; G09G 2320/0271; G09G 2300/0814; H01L 27/156; H01L 25/0753; H01L 33/62; H01L 25/167; H05B 45/44
See application file for complete search history.

(56) References Cited

U.S. PATENT DOCUMENTS

| | | | |
|---|---|---|---|
| 2020/0135092 A1* | 4/2020 | Ahmed | ..................... G09G 3/32 |
| 2020/0152826 A1* | 5/2020 | Lee | ........................ H01L 33/24 |
| 2020/0327843 A1* | 10/2020 | Ahmed | ................ G09G 3/3233 |
| 2021/0241682 A1* | 8/2021 | Jung | ..................... H01L 27/156 |

FOREIGN PATENT DOCUMENTS

| | | |
|---|---|---|
| CN | 112967680 A | 6/2021 |
| TW | 200303499 A | 9/2003 |

* cited by examiner

*Primary Examiner* — Muhammad N Edun
(74) *Attorney, Agent, or Firm* — Muncy, Geissler, Olds & Lowe, P.C.

(57) ABSTRACT

A micro LED display panel and a pixel driving circuit thereof. The pixel driving circuit is used for driving a light-emitting unit, which includes a plurality of micro LEDs connected in series. The pixel driving circuit includes a switch unit, a driving unit and a selection unit. The switch unit controls a data signal input according to a scan signal. The driving unit is electrically connected to the switch unit and the light-emitting unit, and is electrically connected to a first voltage. The selection unit receives a selection signal and is electrically connected to a second voltage. The selection unit is electrically connected to the micro LEDs and the driving unit. The number and brightness of the micro LEDs to be turned on are controlled by the selection unit and the driving unit according to the selection signal and the data signal.

19 Claims, 7 Drawing Sheets

| SS1 | SS2 | Number of activated μLED |
|---|---|---|
| 0 | 1 | 1(L1) |
| 1 | 0 | 2(L1~L2) |

| SS1 | SS2 | Number of activated μLED |
|---|---|---|
| 0 | 1 | 1(L1) |
| 1 | 0 | 4(L1~L4) |

| SS1 | SS2 | SS3 | SS4 | Number of activated μLED |
|---|---|---|---|---|
| 0 | 1 | 0 | 0 | 1(L1) |
| 1 | 0 | 0 | 1 | 2(L1~L2) |
| 1 | 0 | 1 | 0 | 3(L1~L3) |

| SS1 | SS2 | XNOR | Number of activated µLED |
|---|---|---|---|
| 1 | 0 | 0 | 1(L1) |
| 0 | 1 | 0 | 0 |
| 0 | 0 | 1 | 2(L1~L2) |
| 1 | 1 | 1 | 1(L1) |

| SS1 | SS2 | A1 | A2 | A3 | Number of activated μLED |
|---|---|---|---|---|---|
| 1 | 0 | 1 | 0 | 0 | 1(L1) |
| 0 | 1 | 0 | 1 | 0 | 2(L1~L2) |
| 1 | 1 | 0 | 0 | 1 | 3(L1~L3) |
| 0 | 0 | 0 | 0 | 0 | 4(L1~L4) |

MICRO LIGHT-EMITTING DIODE DISPLAY PANEL AND PIXEL DRIVING CIRCUIT THEREOF

CROSS REFERENCE TO RELATED APPLICATIONS

The non-provisional patent application claims priority to U.S. provisional patent application with Ser. No. 63/215,996 filed on Jun. 29, 2021. This and all other extrinsic materials discussed herein are incorporated by reference in their entirety.

BACKGROUND

Technology Field

The present disclosure relates to a pixel driving circuit and, in particular, to a micro light-emitting diode display panel and a pixel driving circuit thereof.

Description of Related Art

Now the world is paying attention to the future display technology, and micro light-emitting diode (micro LED or μLED) is one of the most promising technologies. In brief, micro LED is a technology of miniaturizing and rearranging LEDs, thereby arranging millions or even tens of millions of dies, which are smaller than 100 microns and thinner than a hair, on a substrate. Compared with the current OLED (organic light-emitting diode) display technology, micro LED display device is also a self-luminous device but utilizes different material. Therefore, the micro LED display device can solve the screen burn-in issue, which is the most deadly problem in OLED display device. Besides, micro LED display device further has the advantages of low power consumption, high contrast, wide color gamut, high brightness, small and thin size, light weight and energy saving. Therefore, major factories around the world are scrambling to invest in the research and development of micro LED technology.

The active matrix (AM) driving method has always been the mainstream in the driving technology of micro LED display panels. In the 2T1C circuit structure, for example, the micro LEDs are generally connected to the driving transistors (e.g. TFTs) in series, and the data signals are applied to control the conductions of the driving transistors. Accordingly, the voltage source can provide the driving current through the driving transistors so as to turn on the micro LEDs. However, since the drain-source voltage (VDs) of the driving transistor, which is a necessary voltage to maintain the saturation region, is generally about 4.5V, and the drain-source voltage of the micro LED is generally about 2-3V, most of the power consumption is consumed at the driving transistors, so that the power utilization rate of the micro LEDs is relative low.

SUMMARY

One or more exemplary embodiments of this disclosure are to provide a micro LED display panel and a pixel driving circuit thereof, which can control the number of the micro LEDs, which are connected in series in the pixels, to be turned on and the brightness thereof.

The present disclosure can achieve the following technical effects of (1) increasing the power utilization rate of the micro LEDs in pixels, thereby improving the luminous efficiency (cd/W) of the micro LEDs of the display panel, (2) improving luminous brightness, and (3) implementing more display gray levels, thereby enriching the color expression of the displayed images and increasing the color layers of the displayed images.

In an exemplary embodiment, a pixel driving circuit of this disclosure is used for driving a light-emitting unit, and the light-emitting unit includes a plurality of micro LEDs connected in series. The pixel driving circuit includes a switch unit, a driving unit and a selection unit. The switch unit controls a data signal input according to a scan signal. The driving unit is electrically connected to the switch unit and the light-emitting unit, and the selection unit is electrically connected to the micro LEDs and the driving unit. The driving unit is electrically connected to a first voltage, and the selection unit is electrically connected to a second voltage. The selection unit receives a selection signal. A number and a brightness of the micro LEDs in the light-emitting unit to be turned on are controlled by the selection unit and the driving unit according to the selection signal and the data signal.

In an exemplary embodiment, a micro LED display panel of this disclosure includes a plurality of light-emitting units arranged in array and a driving substrate. Each of the light-emitting units includes a plurality of micro LEDs, which are connected in series. The driving substrate includes a plurality of pixel driving circuits, and the light-emitting units are disposed on the driving substrate and electrically connected to the pixel driving circuits, respectively, to display an image. One of the pixel driving circuits includes a switch unit, a driving unit and a selection unit. The switch unit controls a data signal input according to a scan signal. The driving unit is electrically connected to the switch unit and the light-emitting unit, and the selection unit is electrically connected to the micro LEDs and the driving unit. The driving unit is electrically connected to a first voltage, and the selection unit is electrically connected to a second voltage. The selection unit receives a selection signal. A number and a brightness of the micro LEDs in the light-emitting unit to be turned on are controlled by the selection unit and the driving unit according to the selection signal and the data signal.

In one embodiment, the micro LEDs in any one of the light-emitting units emit lights of the same color.

In one embodiment, the switch unit includes a switch transistor, the driving unit includes a driving transistor, each of the switch transistor and the driving transistor includes a control terminal, a first terminal and a second terminal, the scan signal is inputted to the control terminal of the switch transistor, the data signal is inputted to the first terminal of the switch transistor, the second terminal of the switch transistor is connected to the control terminal of the driving transistor, the first terminal of the driving transistor is connected to the first voltage, and the second terminal of the driving transistor is connected to a first terminal of one of the micro LEDs.

In one embodiment, the light-emitting unit includes a first micro LED and a second micro LED, the selection unit includes a first selection transistor and a second selection transistor, each of the first selection transistor and the second selection transistor includes a control terminal, a first terminal and a second terminal, the selection signal includes a first selection signal and a second selection signal, the first selection signal is inputted to the control terminal of the first selection transistor, the first terminals of the first selection transistor and the second selection transistor are connected to each other and connected to a second terminal of the first micro LED, the second terminal of the first selection transistor is connected to a first terminal of the second micro LED, the second selection signal is inputted to the control terminal of the second selection transistor, and the second terminal of the second selection transistor is electrically connected to the second voltage.

In one embodiment, the light-emitting unit further includes a third micro LED, the second micro LED and the third micro LED are directly connected in series, and the first micro LED is connected to the second micro LED in series via the first selection transistor.

In one embodiment, the first micro LED and the second micro LED are connected respectively to the first terminal and the second terminal of the first selection transistor.

In one embodiment, the light-emitting unit further includes a third micro LED, the selection unit further includes a third selection transistor and a fourth selection transistor, each of the third selection transistor and the fourth selection transistor includes a control terminal, a first terminal and a second terminal, the selection signal further includes a third selection signal and a fourth selection signal, the third selection signal is inputted to the control terminal of the third selection transistor, the first terminal of the third selection transistor is connected to a second terminal of the second micro LED and the first terminal of the fourth selection transistor, the second terminal of the third selection transistor is connected to a first terminal of the third micro LED, the fourth selection signal is inputted to the control terminal of the fourth selection transistor, and the second terminal of the fourth selection transistor is electrically connected to the second voltage.

In one embodiment, the light-emitting unit includes a first micro LED and a second micro LED, the selection unit includes a first selection transistor, a second selection transistor, a third selection transistor and an XNOR gate, each of the first selection transistor, the second selection transistor and the third selection transistor includes a control terminal, a first terminal and a second terminal, the selection signal includes a first selection signal and a second selection signal, the first selection signal is inputted to the control terminal of the first selection transistor and a first input terminal of the XNOR gate, the first terminal of the first selection transistor is connected to the second terminal of the first micro LED and the first terminal of the third selection transistor, the second terminal of the first selection transistor is connected to the second voltage, the second selection signal is inputted to a second input terminal of the XNOR gate, an output terminal of the XNOR gate is connected to the first terminal of the second selection transistor, the control terminal of the second selection transistor receives the scan signal, the second terminal of the second selection transistor is connected to the control terminal of the third selection transistor, and the second terminal of the third selection transistor is connected to the first terminal of the second micro LED.

In one embodiment, the light-emitting unit includes a first micro LED, a second micro LED, a third micro LED and a fourth micro LED, which are directly connected in series, the selection unit includes a first selection transistor, a second selection transistor, a third selection transistor, a first AND gate, a second AND gate and a third AND gate, each of the first selection transistor, the second selection transistor and the third selection transistor includes a control terminal, a first terminal and a second terminal, the selection signal includes a first selection signal and a second selection signal, the first selection signal is inputted to a first input terminal of the first AND gate and a first input terminal of the third AND gate, a reverse signal of the first selection signal is inputted to a first input terminal of the second AND gate, the second selection signal is inputted to a second input terminal of the second AND gate and a second input terminal of the third AND gate, a reverse signal of the second selection signal is inputted to a second input terminal of the first AND gate, an output terminal of the first AND gate is connected to the control terminal of the first selection transistor, an output terminal of the second AND gate is connected to the control terminal of the second selection transistor, an output terminal of the third AND gate is connected to the control terminal of the third selection transistor, the first terminal of the first selection transistor is connected to a second terminal of the first micro LED and a first terminal of the second micro LED, the first terminal of the second selection transistor is connected to a second terminal of the second micro LED and a first terminal of the third micro LED, the first terminal of the third selection transistor is connected to a second terminal of the third micro LED and a first terminal of the fourth micro LED, and the second terminals of the first selection transistor, the second selection transistor and the third selection transistor are connected to the second voltage.

In one embodiment, the light-emitting unit includes at least three micro LEDs, which are directly connected in series, the selection unit includes a plurality of output terminals, each of the output terminals is disposed between adjacent two of the connected micro LEDs, and is connected a first terminal of one micro LED and a second terminal of another micro LED, and the selection unit includes a logic gate and a field-effect transistor.

In one embodiment, a part of the selection unit is connected between the micro LEDs in series.

As mentioned above, in the micro LED display panel and the pixel driving circuit thereof of this disclosure, the switch unit controls a data signal input according to a scan signal, the driving unit is electrically connected to the switch unit and the light-emitting unit and electrically connected to a first voltage, and the selection unit receives a selection signal, is electrically connected to a second voltage, and is electrically connected to the micro LEDs and the driving unit. A number and a brightness of the micro LEDs in the light-emitting unit to be turned on are controlled by the selection unit and the driving unit according to the selection signal and the data signal. Based on the above-mentioned circuit design, the present disclosure can achieve the following technical effects of (1) increasing the power utilization rate of the micro LEDs in pixels, thereby improving the luminous efficiency (cd/W) of the micro LEDs of the display panel, (2) improving luminous brightness, and (3) implementing more display gray levels, thereby enriching the color expression of the displayed images and increasing the color layers of the displayed images.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
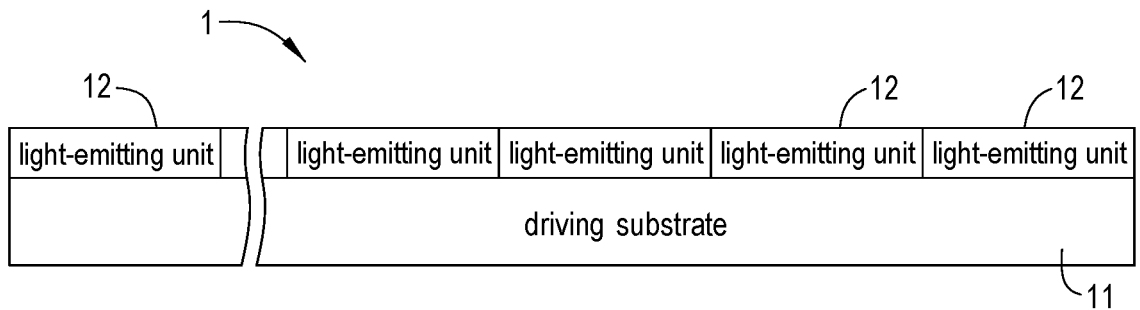
FIGS. 1A and 1B are different schematic diagrams of a micro LED display panel according to an embodiment of this disclosure.
Figure 1B:
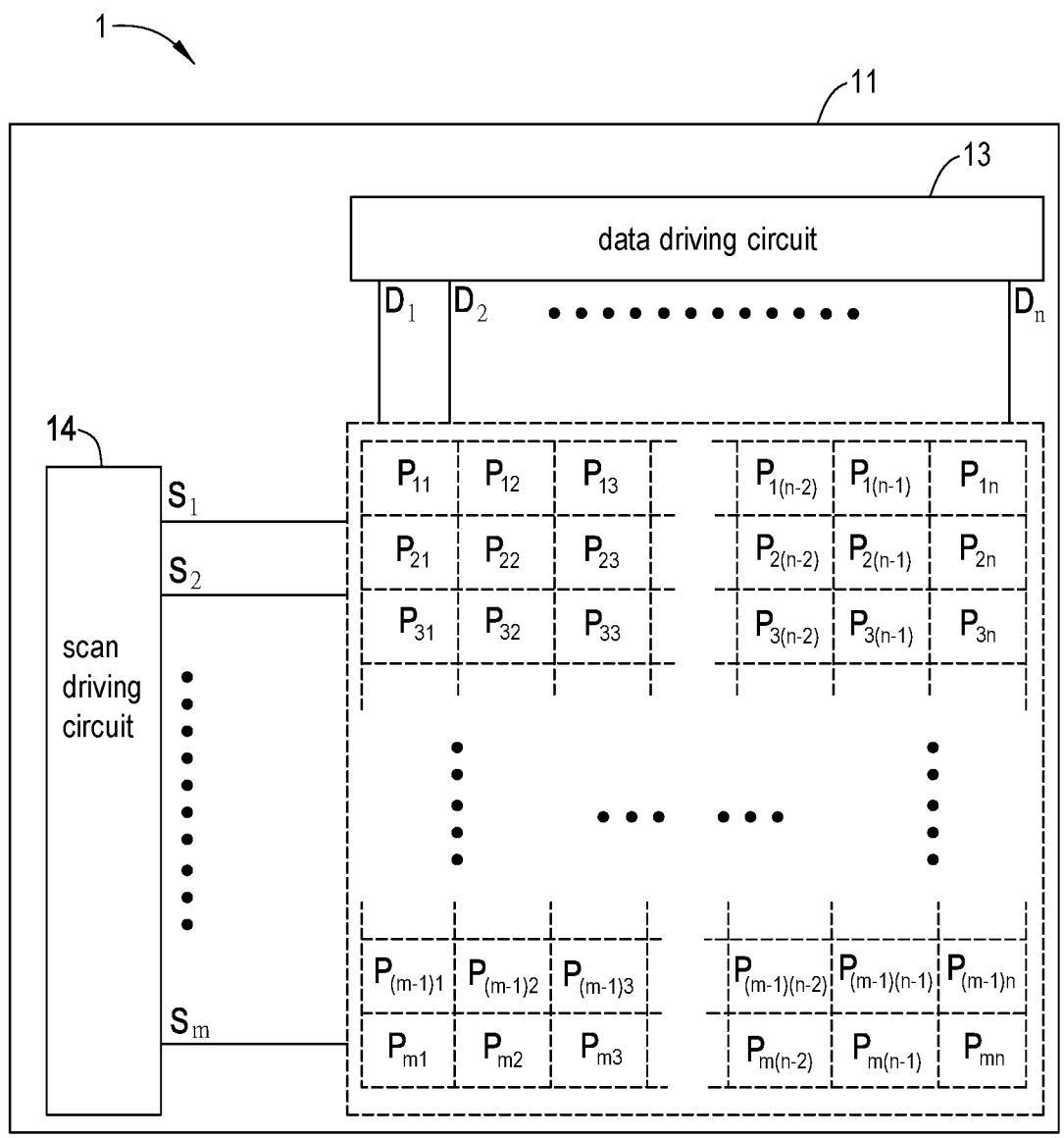

FIG. 1A and FIG. 1B are different schematic diagrams of a micro LED display panel 1 according to an embodiment of this disclosure, wherein FIG. 1B does not show the light-emitting unit 12.

Referring to FIGS. 1A and 1B, the micro LED display panel 1 is an AM display panel and includes a driving substrate 11 and a plurality of light-emitting units 12 arranged in array. The light-emitting units 12 can be arranged in a two-dimensional array and disposed on the driving substrate 11. In different embodiments, the light-emitting units 12 can be arranged in a one-dimensional array, and this disclosure is not limited thereto. Each light-emitting unit 12 can be, for example but not limited to, a red light-emitting unit, a blue light-emitting unit, a green light-emitting unit, or a light-emitting unit of any of other colors. Each of the light-emitting units 12 includes a plurality of micro LEDs (not shown), which are connected in series, and the micro LEDs in any one of the light-emitting units 12 emit lights of the same color. In other words, no matter how many micro LEDs are arranged in any one of the light-emitting units 12, all of the micro LEDs in one light-emitting units 12 can emit lights of the same color. To be noted, the term "connected in series" includes "directly connected in series" and "not directly connected in series" (with one or more other components or units connected therebetween and connected in series).

Figures 2A, 2B:
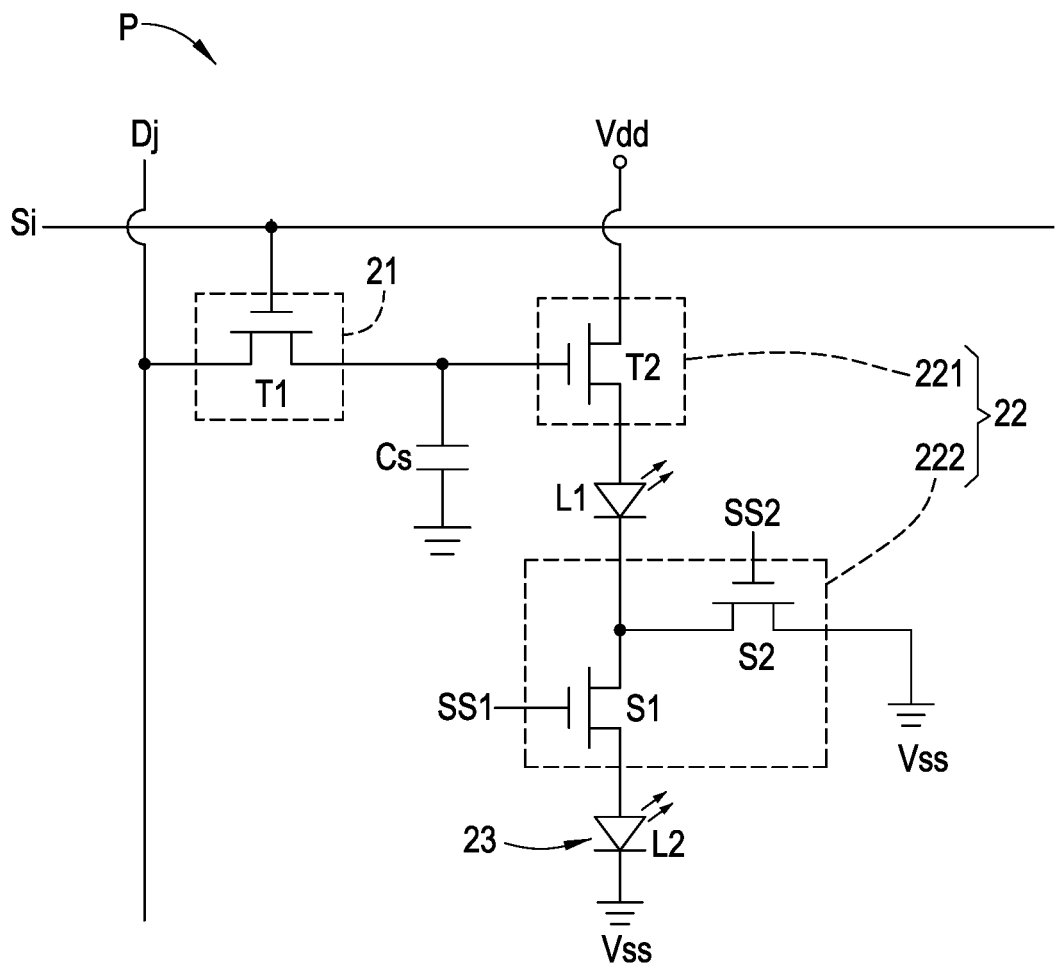
FIG. 2A is a schematic diagram showing the circuit of one pixel in the micro LED display panel of FIG. 1B.
FIG. 2B shows a table indicating the corresponding values of the selection signals and the numbers of the activated micro LEDs in the light-emitting unit in one pixel of FIG. 2A.

The driving substrate 11 is a substrate configured for driving the light-emitting units 12 to emit light for displaying an image. For example, the driving substrate 11 may be a complementary metal-oxide-semiconductor (CMOS) substrate, a liquid crystal on silicon (LCOS) substrate, or a thin-film transistor (TFT) substrate, or any of other circuit substrates with working circuits, but this disclosure is not limited thereto. When the driving substrate 11 drives the micro LEDs of the light-emitting units 12 to activate or to turn on, the micro LED display panel 1 can display images. The driving substrate 11 includes a plurality of pixel driving circuits, which are electrically connected to the light-emitting units (e.g. in a one-to-one electrical connection), so that each pixel driving circuit can drive the corresponding light-emitting unit 12 to emit light. In this embodiment, one pixel driving circuit and one corresponding light-emitting unit 12 can be together defined as one "pixel". Therefore, as shown in FIG. 1B, the micro LED display panel 1 includes a plurality of pixels $P_{11}$ to $P_{mn}$, which are arranged in an array with n columns and m rows. As shown in FIG. 2A, each of the pixels $P_{11} \sim P_{mn}$ includes one pixel driving circuit and one light-emitting unit.

In addition, the micro LED display panel 1 further includes a data driving circuit 13, a scan driving circuit 14, a plurality of data lines $D_1 \sim D_n$, and a plurality of scan lines $S_1 \sim S_m$. The data driving circuit 13, the scan driving circuit 14, the data lines $D_1 \sim D_n$, and the scan lines $S_1 \sim S_m$ are all disposed on the driving substrate 11. The data driving circuit 13 is disposed next to the pixels $P_{11} \sim P_{mn}$, and is electrically connected to the pixels $P_{11} \sim P_{mn}$ via the data lines $D_1 \sim D_n$. Accordingly, the data driving circuit 13 can output a data signal to the pixels $P_{11} \sim P_{mn}$ (pixel driving circuits) through the data lines $D_1 \sim D_n$. The scan driving circuit 14 is disposed next to the pixels $P_{11} \sim P_{mn}$, and is electrically connected to the pixels $P_{11} \sim P_{mn}$ via the scan lines $S_1 \sim S_m$. Accordingly, the scan driving circuit 14 can output a scan signal to the pixels $P_{11} \sim P_{mn}$ (pixel driving circuits) row-by-row through the scan lines $S_1 \sim S_m$. Moreover, the data driving circuit 13 can further output a first voltage Vdd and a second voltage Vss (see FIG. 2A) to the pixels $P_{11} \sim P_{mn}$, respectively. The first voltage Vdd is a DC driving voltage for driving the light-emitting units (i.e., the micro LEDs) of the pixels $P_{11} \sim P_{mn}$ to emit light, and the second voltage Vss is used a common voltage of the pixels $P_{11} \sim P_{mn}$. In this embodiment, the first voltage Vdd is greater than the second voltage Vss. In some embodiments, if an N-type transistor is used, the first voltage Vdd is, for example, 4.5V, and the second voltage Vss is a ground voltage (0V), but this disclosure is not limited thereto. In other embodiments, a P-type transistor or a combination transistor can be used with properly adjusting the voltage sources.

In the micro LED display panel 1, when the scan driving circuit 14 sequentially outputs a scan signal to the scan lines $S_1 \sim S_m$ to conduct the pixels row-by-row, the data driving circuit 13 can output the data signals corresponding to each row of pixels $P_{11} \sim P_{mn}$ to the pixels $P_{11} \sim P_{mn}$ (the pixel driving circuits) via the data lines $D_1 \sim D_n$. Accordingly, the first voltage Vdd and the second voltage Vss can be transmitted from the data driving circuit 13 to the pixels $P_{11} \sim P_{mn}$, thereby activating or turning on the micro LEDs of the pixels $P_{11} \sim P_{mn}$ and thus enabling the display panel 1 to display images.

The operation of one pixel in the micro LED display panel 1 of this embodiment will be described in detail with reference to FIGS. 2A and 2B. FIG. 2A is a schematic diagram showing the circuit of one pixel in the micro LED display panel 1 of FIG. 1B, and FIG. 2B shows a table indicating the corresponding values of the selection signals and the numbers of the activated micro LEDs in the light-emitting unit in one pixel of FIG. 2A.

The pixel P of FIG. 2A is, for example, a 2T1C circuit structure, but this disclosure is not limited thereto. In different embodiments, each pixel P (pixel driving circuit) can be any of other circuit structures. In addition, the symbol "i" can be an integer ranged between 1 and m (1≤i≤m), and the symbol "j" can be an integer ranged between 1 and n (1≤i≤n). To be noted, in the following content, "the control terminal" of a transistor can be the gate of the transistor, "the first terminal" of a transistor can be the first source/drain of the transistor, and "the second terminal" of a transistor can be the second source/drain of the transistor.

In this embodiment as shown in FIG. 2A, the pixel P includes a switch unit 21, a selection driving unit 22 and a light-emitting unit 23. In addition, the pixel P further includes a capacitor Cs. In other words, the pixel driving circuit further includes, other than the light-emitting units 23, some other components, such as the switch units 21, the selection driving units 22 and the capacitors Cs.

The switch unit 21 controls a data signal $D_j$ input according to a scan signal $S_i$. In this case, the switch unit 21 includes a switch transistor T1, which has a control terminal, a first terminal and a second terminal. The scan signal $S_i$ is inputted to the control terminal of the switch transistor T1, the data signal $D_j$ is inputted to the first terminal of the switch transistor T1, and the second terminal of the switch transistor T1 is connected to the selection driving unit 22. In this embodiment, the switch transistor T1 is an N-type transistor such as, for example but not limited to, an N-type MOSFET. Those skilled in the art should understand that, in other embodiments, the switch transistor T1 can be a P-type transistor.

The selection driving unit 22 is electrically connected to the switch unit 21, and the selection driving unit 22 includes a driving unit 221 and a selection unit 222. The driving unit 221 is electrically connected to the switch unit 21, the light-emitting unit 12 and the selection unit 222, and is electrically connected to the first voltage Vdd. In this case, the driving unit 221 is electrically connected (not directly connection) to the selection unit 222 via one of the micro LEDs of the light-emitting unit 23. In this embodiment, a partial circuit of the selection unit 222 (a first selection transistor S1) is connected between the micro LEDs in series. In addition, the selection unit 222 is electrically connected to the micro LEDs of the light-emitting unit 23, and is electrically connected to the second voltage Vss. Herein, the selection driving unit 22 can, based on the data signal Dj transmitted by the switch unit 21 and the selection signal (SS1, SS2) received by the selection unit 222, control a number and a brightness of the micro LEDs in the light-emitting unit 23 to be turned on.

In this embodiment, the driving unit 221 includes a driving transistor T2, which has a control terminal, a first terminal and a second terminal. The control terminal of the driving transistor T2 is connected to the second terminal of the switch transistor T1, the first terminal of the driving transistor T2 is connected to the first voltage Vdd, and the second terminal of the driving transistor T2 is connected to the first terminal of one of the micro LEDs. In this embodiment, the light-emitting unit 23 includes a first micro LED L1 and a second micro LED L2, and the first micro LED L1 and the second micro LED L2 emit lights of the same color. Each of the first micro LED L1 and the second micro LED L2 includes a first terminal and a second terminal. The second terminal of the driving transistor T2 is connected to the first terminal of the first micro LED L1, so that the driving transistor T2 can be indirectly and electrically connected to the selection unit 222 via the first micro LED L1.

In addition, the second terminal of the first micro LED L1 is indirectly connected to the second micro LED L2 in series via the selection unit 222. The driving transistor T2 is used as the driving device of the light-emitting unit 23. The control terminal of the driving transistor T2 is connected to the second terminal of the switch transistor T1, and is connected to the second voltage Vss via the capacitor Cs. Accordingly, when the scan signal Si conducts the switch transistor T1, the driving transistor T2 can receive the data signal Dj from the switch transistor T1, and the capacitor Cs can remain the conduct voltage required for the control terminal of the driving transistor T2.

In this embodiment, the selection unit 222 includes a first selection transistor S1 and a second selection transistor S2. Each of the first selection transistor S1 and the second selection transistor S2 includes a control terminal, a first terminal and a second terminal. The above-mentioned selection signal includes two signals (i.e. a first selection signal SS1 and a second selection signal SS2). The first selection signal SS1 is inputted to the control terminal of the first selection transistor S1, the second selection signal SS2 is inputted to the control terminal of the second selection transistor S2. In addition, the first terminals of the first selection transistor S1 and the second selection transistor S2 are connected to each other and connected to the second terminal of the first micro LED L1. The second terminal of the first selection transistor S1 is connected to the first terminal of the second micro LED L2. The second terminal of the second selection transistor S2 and the second terminal of the second micro LED L2 are electrically connected to the second voltage Vss.

Accordingly, in the pixel P (the pixel driving circuit) of this embodiment, when the scan signal Si controls to conduct the switch transistor T1, the driving transistor T2 can receive the data signal Dj from the switch transistor T1 so as to conduct the driving transistor T2, and the first voltage Vdd can be transmitted to the light-emitting unit 23 via the driving transistor T2. As a result, the number and the brightness of the micro LEDs in the light-emitting unit 23 to be turned on can be controlled by the selection unit 222 and the driving unit 221 according to the selection signal (including the first selection signal SS1 and the second selection signal SS2) and the data signal Dj.

Specifically, with reference to FIGS. 2A and 2B, "1" as shown in FIG. 2B indicates the corresponding selection transistor is conducted, and "0" indicates the corresponding selection transistor is not conducted. In this embodiment, when the first selection signal SS1 is "0" (which means that the first selection transistor S1 is not conducted) and the second selection signal SS2 is "1" (which means that the second selection transistor S2 is conducted), the first micro LED L1 is turned on. When the first selection signal SS1 is "1" and the second selection signal SS2 is "0", the first micro LED L1 and the second micro LED L2 are turned on. Accordingly, the number and the brightness of the micro LEDs (one or two micro LEDs) in the light-emitting unit 23 to be turned on are controlled by the pixel P (the pixel driving circuit) of this embodiment based on the data signal Dj transmitted by the switch unit 21 (the switch transistor T1) and the selection signal (SS1, SS2) received by the selection unit 222.

Figures 3A, 3B:
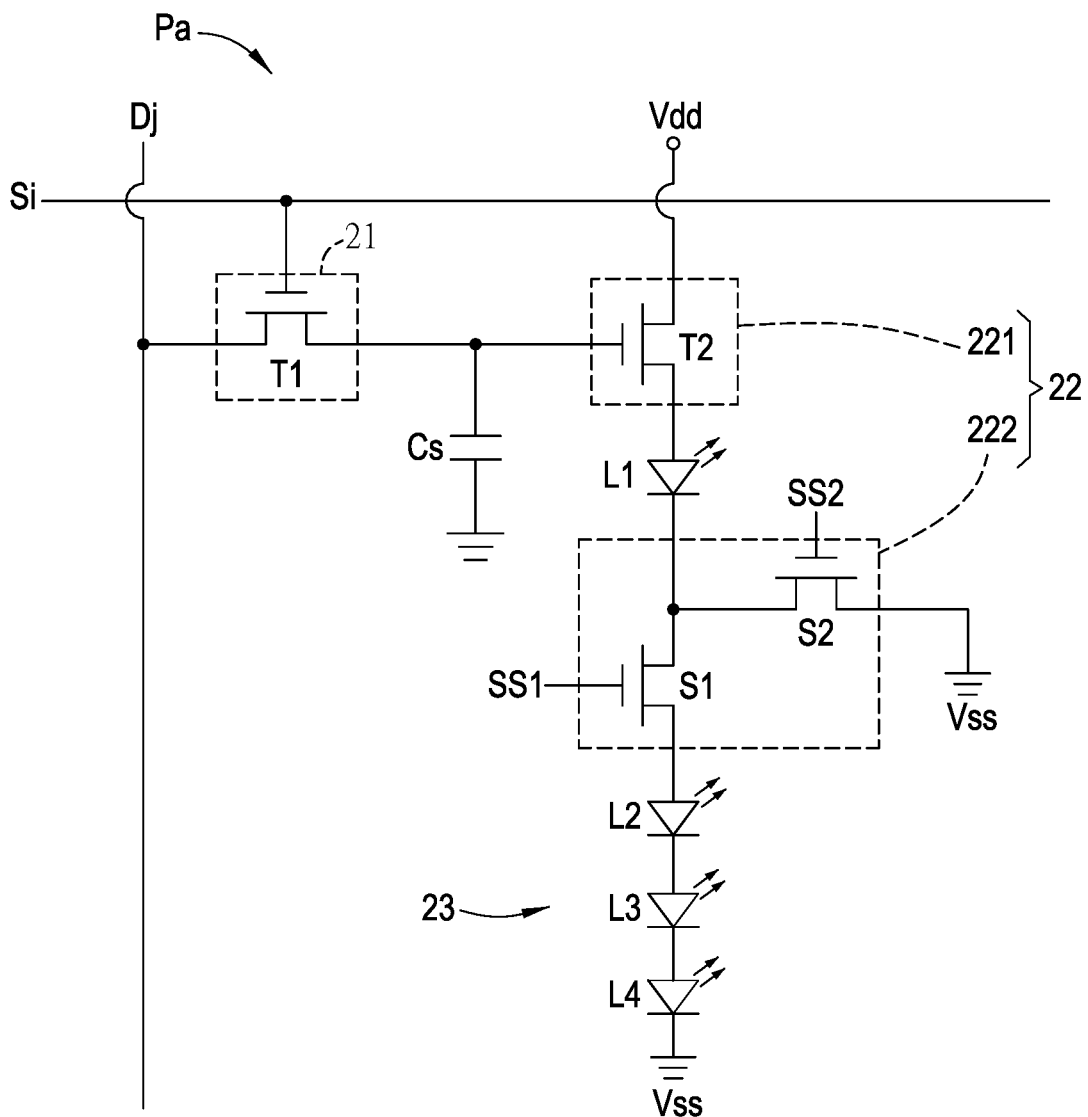
FIG. 3A is a schematic diagram showing another circuit of one pixel in the micro LED display panel of FIG. 1B.
FIG. 3B shows a table indicating the corresponding values of the selection signals and the numbers of the activated micro LEDs in the light-emitting unit in one pixel of FIG. 3A.
Figures 4A, 4B:
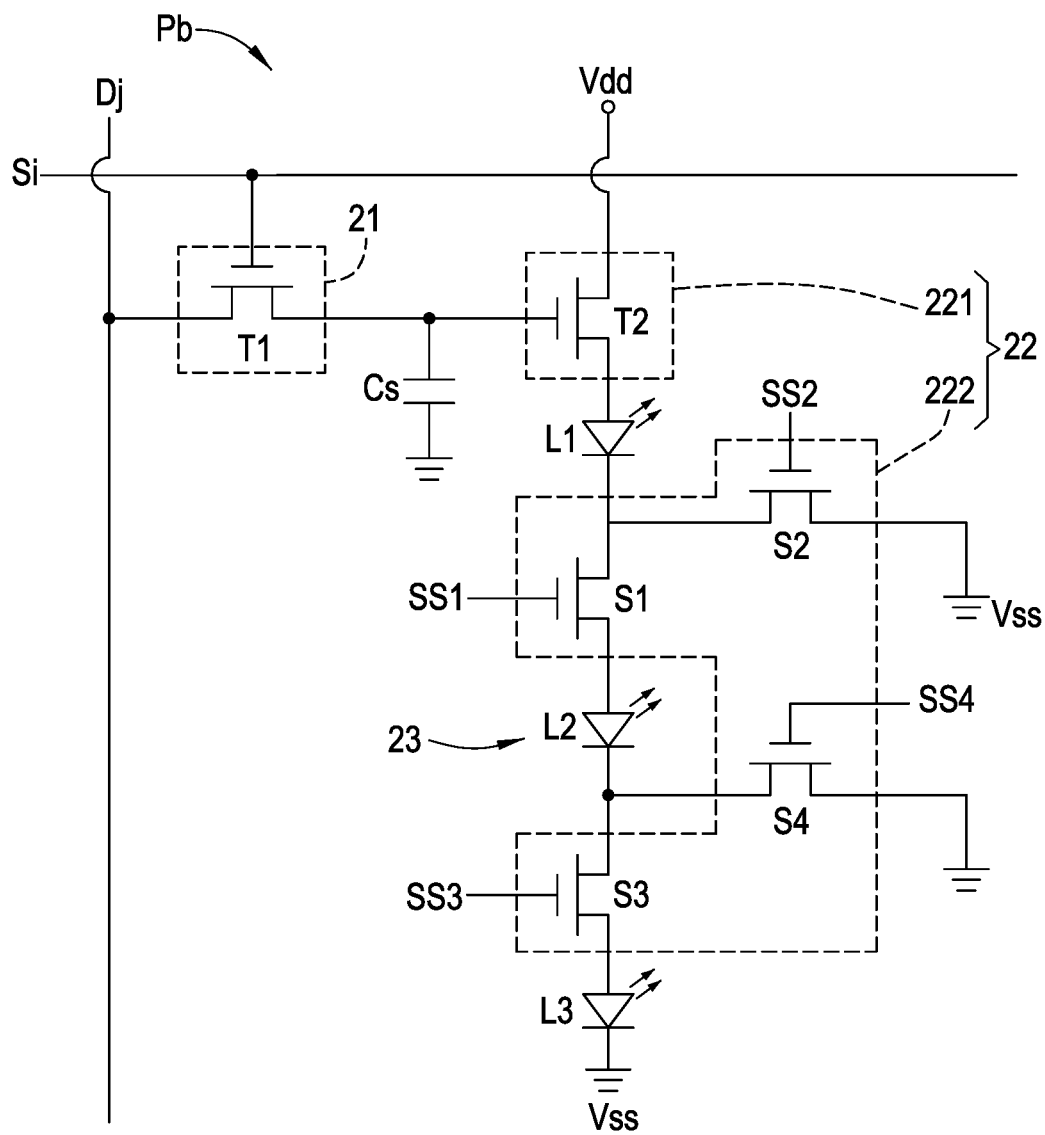
FIG. 4A is a schematic diagram showing another circuit of one pixel in the micro LED display panel of FIG. 1B.
FIG. 4B shows a table indicating the corresponding values of the selection signals and the numbers of the activated micro LEDs in the light-emitting unit in one pixel of FIG. 4A.
Figure 5A:
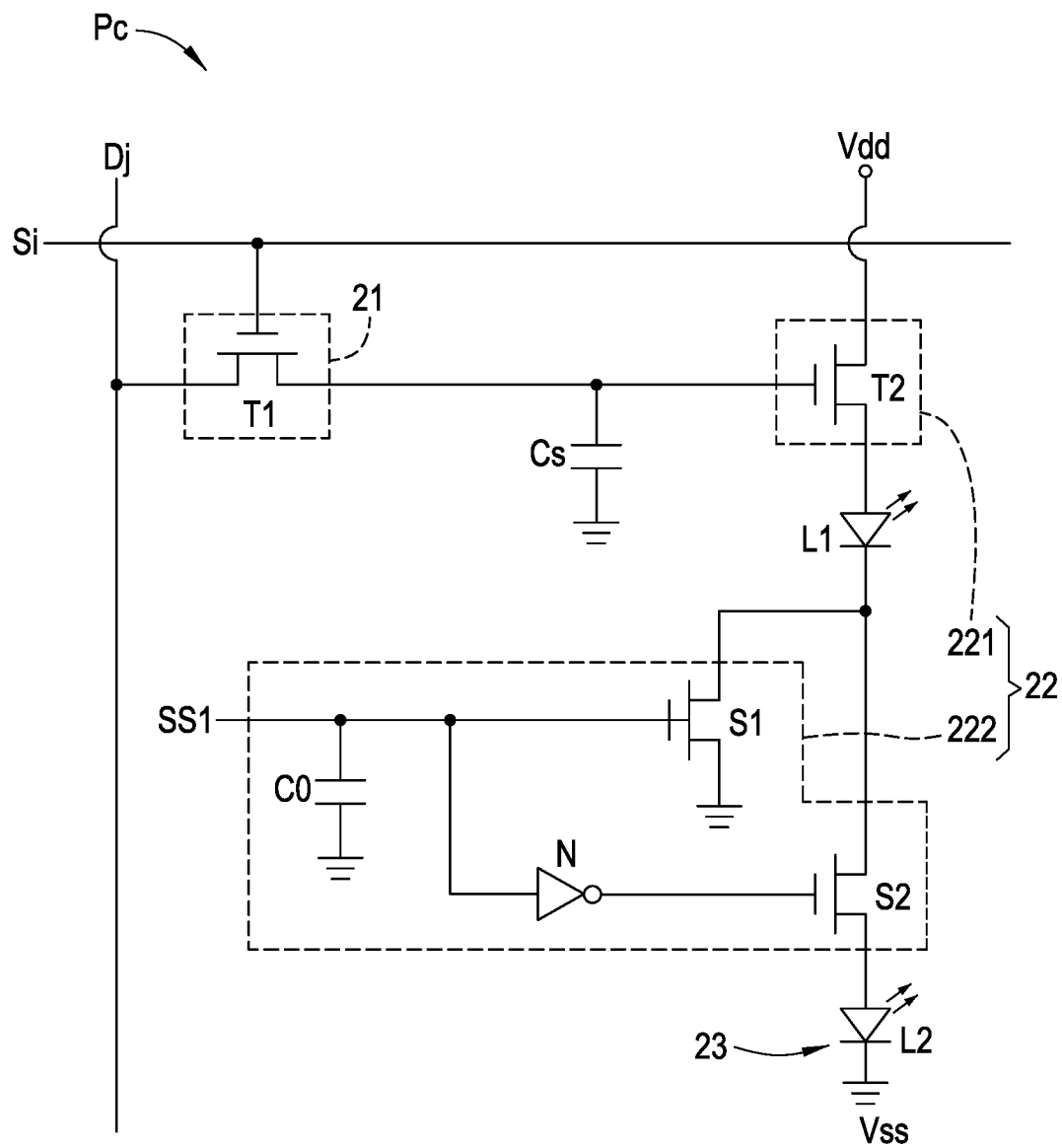
FIG. 5A is a schematic diagram showing another circuit of one pixel in the micro LED display panel of FIG. 1B.
Figures 5B, 5C:
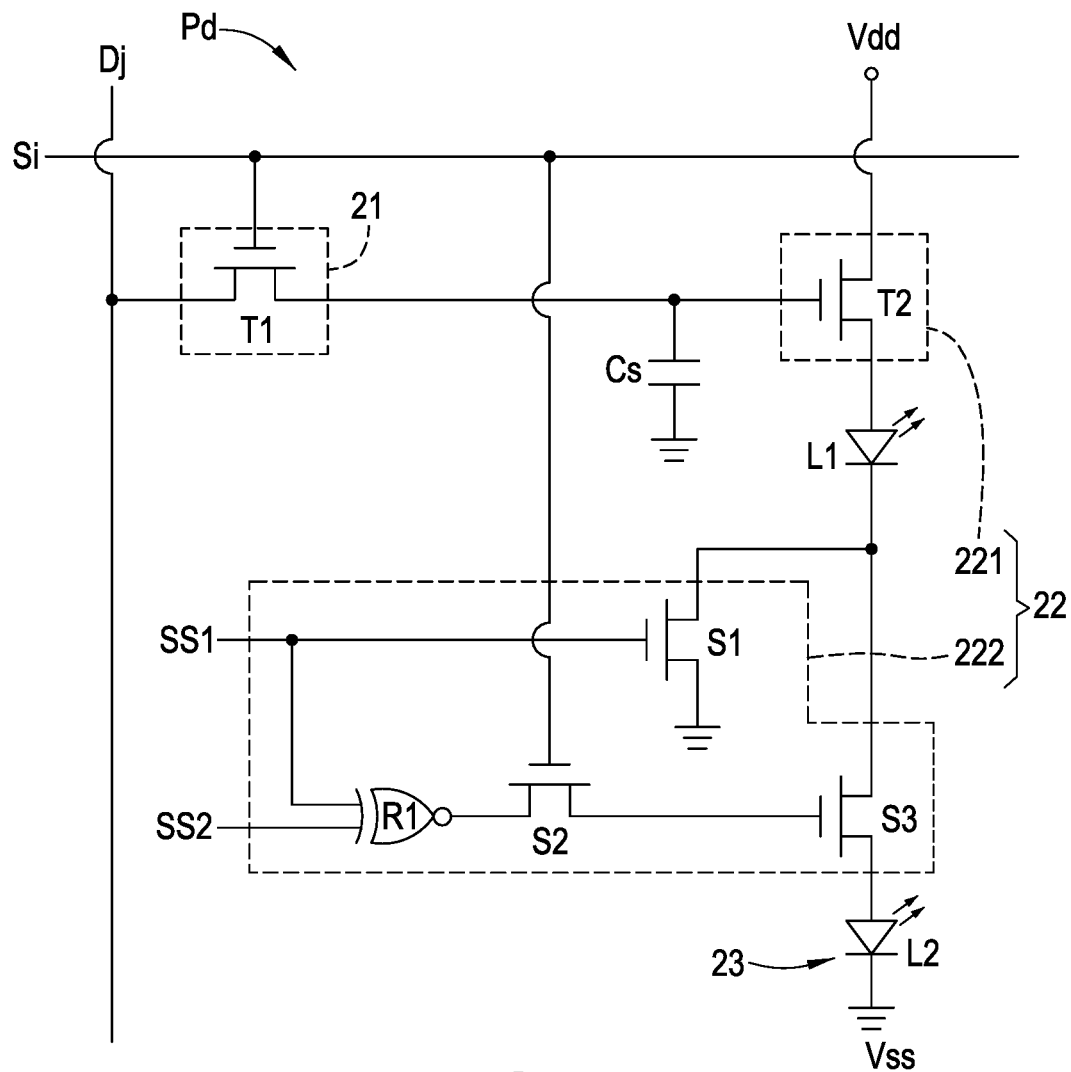
FIG. 5B is a schematic diagram showing another circuit of one pixel in the micro LED display panel of FIG. 1B.
FIG. 5C shows a table indicating the corresponding values of the selection signals and the numbers of the activated micro LEDs in the light-emitting unit in one pixel of FIG. 5B.
Figures 6A, 6B:
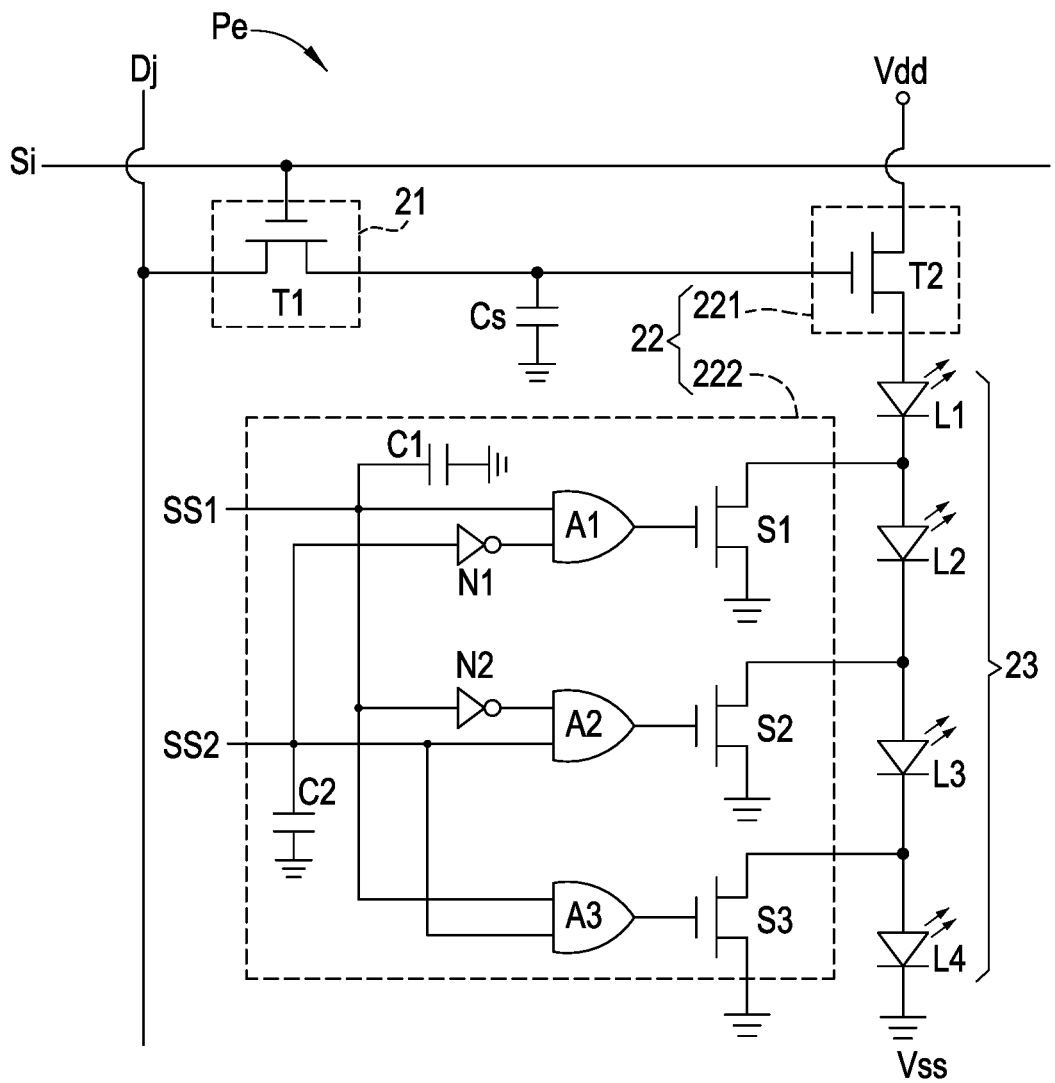
FIG. 6A is a schematic diagram showing another circuit of one pixel in the micro LED display panel of FIG. 1B.
FIG. 6B shows a table indicating the corresponding values of the selection signals and the numbers of the activated micro LEDs in the light-emitting unit in one pixel of FIG. 6A.

FIG. 3A is a schematic diagram showing another circuit of one pixel in the micro LED display panel 1 of FIG. 1B, and FIG. 3B shows a table indicating the corresponding values of the selection signals and the numbers of the activated micro LEDs in the light-emitting unit in one pixel of FIG. 3A. FIG. 4A is a schematic diagram showing another circuit of one pixel in the micro LED display panel 1 of FIG. 1B, and FIG. 4B shows a table indicating the corresponding values of the selection signals and the numbers of the activated micro LEDs in the light-emitting unit in one pixel of FIG. 4A. FIG. 5A is a schematic diagram showing another circuit of one pixel in the micro LED display panel 1 of FIG. 1B, FIG. 5B is a schematic diagram showing another circuit of one pixel in the micro LED display panel 1 of FIG. 1B, and FIG. 5C shows a table indicating the corresponding values of the selection signals and the numbers of the activated micro LEDs in the light-emitting unit in one pixel of FIG. 5B. FIG. 6A is a schematic diagram showing another circuit of one pixel in the micro LED display panel 1 of FIG. 1B, and FIG. 6B shows a table indicating the corresponding values of the selection signals and the numbers of the activated micro LEDs in the light-emitting unit in one pixel of FIG. 6A. As shown in FIGS. 3A, 4A, 5A and 5B, a partial circuit of the selection unit 222 is still connected between the micro LEDs in series. As shown in FIG. 6A, the micro LEDs of the light-emitting unit 23 are directly connected in series.

Referring to FIGS. 3A and 3B, unlike the pixel P of the previous embodiment, the light-emitting unit 23 of the pixel Pa of this embodiment further includes a third micro LED L3 and a fourth micro LED L4 in addition to the first micro LED L1 and the second micro LED L2. In this embodiment, the second micro LED L2, the third micro LED L3 and the fourth micro LED L4 are directly connected in series, and the first micro LED L1 is connected to the second micro LED L2, the third micro LED L3 and the fourth micro LED L4 in series via the first selection transistor S1.

Therefore, in the pixel Pa of this embodiment, the number and the brightness of the micro LEDs in the light-emitting unit 23 to be turned on can be controlled based on the data signal Dj transmitted by the switch unit 21 (the switch transistor T1), the first selection signal SS1 received by the first selection transistor S1 of the selection unit 222, and the second selection signal SS2 received by the second selection transistor S2 of the selection unit 222. Specifically, when the first selection signal SS1 is "0" and the second selection signal SS2 is "1", the first micro LED L1 is turned on. When the first selection signal SS1 is "1" and the second selection signal SS2 is "0", the second micro LED L2, the third micro LED L23 and the fourth micro LED L4 are turned on. Accordingly, the pixel Pa of this embodiment can control the number of the micro LEDs (one or four micro LEDs) in the light-emitting unit 23 to be turned on and the brightness of the micro LEDs based on the selection signal (SS1, SS2) received by the selection unit 222.

Referring to FIGS. 4A and 4B, unlike the pixel P of the previous embodiment, the light-emitting unit 23 of the pixel Pb of this embodiment further includes a third micro LED L3 in addition to the first micro LED L1 and the second micro LED L2. In this embodiment, the three micro LEDs L1, L2 and L3 are indirectly connected in series via the selection unit 222, and the second terminal of the third micro LED L3 is electrically connected to the second voltage Vss. Moreover, the selection unit 222 of the pixel Pb further includes a third selection transistor S3 and a fourth selection transistor S4 in addition to the first selection transistor S1 and the second selection transistor S2. Each of the third selection transistor S3 and the fourth selection transistor S4 includes a control terminal, a first terminal and a second terminal. The selection signal further includes a third selection signal SS3 and a fourth selection signal SS4. The third selection signal SS3 is inputted to the control terminal of the third selection transistor S3, and the fourth selection signal SS4 is inputted to the control terminal of the fourth selection transistor S4. The first terminal of the third selection transistor S3 is connected to the second terminal of the second micro LED L2 and the first terminal of the fourth selection transistor S4, the second terminal of the third transistor S3 is connected to the first terminal of the third micro LED L3, and the second terminal of the fourth selection transistor S4 is connected to the second voltage Vss.

Therefore, in the pixel Pb of this embodiment, the number and the brightness of the micro LEDs in the light-emitting unit 23 to be turned on can be controlled based on the data signal Dj transmitted by the switch unit 21 (the switch transistor T1), the first selection signal SS1 received by the first selection transistor S1 of the selection unit 222, the second selection signal SS2 received by the second selection transistor S2 of the selection unit 222, the third selection signal SS3 received by the third selection transistor S3 of the selection unit 222, and the fourth selection signal SS4 received by the fourth selection transistor S4 of the selection unit 222. Specifically, as shown in FIG. 4B, when the first selection signal SS1, the third selection signal SS3 and the fourth selection signal SS4 are "0", and the second selection signal SS2 is "1", the first micro LED L1 is turned on. When the first selection signal SS1 and the fourth selection signal SS4 are "1", and the second selection signal SS2 and the third selection signal SS3 are "0", two micro LEDs (the first micro LED L1 and the second micro LED L2) are turned on. When the first selection signal SS1 and the third selection signal SS3 are "1", and the second selection signal SS2 and the fourth selection signal SS4 are "0", three micro LEDs (the first micro LED L1, the second micro LED L2 and the third micro LED L3) are turned on. Accordingly, in the pixel Pb of this embodiment, the number and the brightness of the micro LEDs in the light-emitting unit 23 to be turned on of the micro LEDs can be controlled based on the data signal Dj transmitted by the switch unit 21 (the switch transistor T1) and the selection signals (SS1~SS4) received by the selection unit 222.

Unlike the pixel P of the previous embodiment, in the pixel Pc of this embodiment as shown in FIG. 5A, the selection unit 222 comprises a first selection transistor S1, a second selection transistor S2 and a NOT gate N. In this embodiment, each of the first selection transistor S1 and the second selection transistor S2 includes a control terminal, a first terminal and a second terminal. The first selection signal SS1 is inputted to the control terminal of the first selection transistor S1 and the input terminal of the NOT gate N. The first terminal of the first selection transistor S1 is connected to the second terminal of the first micro LED L1 and the first terminal of the second selection transistor S2, the second terminal of the first selection transistor S1 is connected to the second voltage Vss. The output terminal of the NOT gate N is connected to the control terminal of the second selection transistor S2, and the second terminal of the second selection transistor S2 is connected to the first terminal of the second micro LED L2. Referring to FIG. 5A, one terminal of the capacitor C is connected to the control terminal of the first selection transistor S1, and the other terminal of the capacitor C is grounded. The capacitor C is configured to store (record) the inputted first selection signal SS1.

Therefore, in the pixel Pc of this embodiment, the number and the brightness of the micro LEDs in the light-emitting unit 23 to be turned on can be controlled based on the data signal Dj transmitted by the switch unit 21 (the switch transistor T1) and the first selection signal SS1. Specifically, when the first selection signal SS1 is "1", the first selection transistor S1 is conducted and the second selection transistor S2 is not conducted, thereby turning on the first micro LED L1. When the first selection signal SS1 is "0", the first selection transistor S1 is not conducted and the second selection transistor S2 is conducted, thereby turning on the first micro LED L1 and the second micro LED L2.

Unlike the pixel P of the previous embodiment, in the pixel Pd of this embodiment as shown in FIGS. 5B and 5C, the selection unit 222 comprises a first selection transistor S1, a second selection transistor S2, a third selection transistor S3 and an XNOR gate R1. In this embodiment, each of the first selection transistor S1, the second selection transistor S2 and the third selection transistor S3 includes a control terminal, a first terminal and a second terminal. The first selection signal SS1 is inputted to the control terminal of the first selection transistor S1 and the first input terminal of the XNOR gate R1. The first terminal of the first selection transistor S1 is connected to the second terminal of the first micro LED L1 and the first terminal of the third selection transistor S3, the second terminal of the first selection transistor S1 is connected to the second voltage Vss. The second selection signal SS2 is inputted to the second input terminal of the XNOR gate R1, the output terminal of the XNOR gate R1 is connected to the first terminal of the second selection transistor S2, and the control terminal of the second selection transistor S2 receives the scan signal S1. The second terminal of the second selection transistor S2 is connected to the control terminal of the third selection transistor S3, and the second terminal of the third selection transistor S3 is connected to the first terminal of the second micro LED L2.

Therefore, in the pixel Pd of this embodiment, the number and the brightness of the micro LEDs in the light-emitting unit 23 to be turned on can be controlled based on the data signal Dj transmitted by the switch unit 21 (the switch transistor T1), the first selection signal SS1 and the second selection signal SS2. Specifically, as shown in FIG. 5B, when the first selection signal SS1 is "1" and the second selection signal SS2 is "0", the output of the XNOR gate R1 is "0", so that the first selection transistor S1 and the second selection transistor S2 are conducted while the third selection transistor S3 is not conducted, thereby turning on the first micro LED L1. When the first selection signal SS1 is "0" and the second selection signal SS2 is "1", the output of the XNOR gate R1 is "0", so that the first selection transistor S1 is not conducted, the second selection transistor S2 is conducted, and the third selection transistor S3 is not conducted. In this case, no micro LED is turned on. When the first selection signal SS1 is "0" and the second selection signal SS2 is "0", the output of the XNOR gate R1 is "1", so that the first selection transistor S1 is not conducted, the second selection transistor S2 is conducted, and the third selection transistor S3 is conducted, thereby turning on the first micro LED L1 and the second micro LED L2. When the first selection signal SS1 is "1" and the second selection signal SS2 is "1", the output of the XNOR gate R1 is "1", so that the first selection transistor S1, the second selection transistor S2 and the third selection transistor S3 are conducted, thereby turning on the first micro LED L1 only.

If the number of the micro LEDs connected in series is larger, and the number of control modes of various turn-on micro LEDs and brightness is larger, the configuration of logic gate(s) can make the control circuit of the selection unit 222 simpler and have lower cost. In some embodiments, the light-emitting unit 23 can include at least three micro LEDs directly connected in series, and the selection unit 222 can include a plurality of output terminals respectively disposed between any adjacent two series-connected micro LEDs, and is connected a first terminal of one micro LED and a second terminal of another micro LED. Herein, the selection unit 222 includes logic gates and field effect transistors. For example, as shown in FIG. 6A and FIG. 6B, unlike the pixel P of the previous embodiment, the light-emitting unit 23 of the pixel Pe of this embodiment includes a first micro LED L1, a second micro LED L2, a third micro LED L3 and a fourth micro LED L4, which are directly connected in series. The second terminal of the fourth micro LED L4 is connected to the second voltage Vss. In addition, the selection unit 222 of this embodiment includes a first selection transistor S1, a second selection transistor S2, a third selection transistor S3, a first AND gate A1, a second AND gate A2, a third AND gate A3, and two NOT gates N1 and N2. Each of the first selection transistor S1, the second selection transistor S2 and the third selection transistor S3 includes a control terminal, a first terminal and a second terminal. To be noted, the first terminals of the first selection transistor S1, the second selection transistor S2 and the third selection transistor S3 are the output terminals of the selection unit 222. The first selection signal SS1 is respectively inputted to the first input terminal of the first AND gate A1 and the first input terminal of the third AND gate A3, and the reverse signal of the first selection signal SS1 (after reversed by the NOT gate N2) is inputted to the first input terminal of the second AND gate A2. The second selection signal SS2 is respectively inputted to the second input terminal of the second AND gate A2 and the second input terminal of the third AND gate A3, and the reverse signal of the second selection signal SS2 (after reversed by the NOT gate N1) is inputted to the second input terminals of the first AND gate A1. In addition, the output terminal of the first AND gate A1 is connected to the control terminal of the first selection transistor S1, the output terminal of the second AND gate A2 is connected to the control terminal of the second selection transistor S2, and the output terminal of the third AND gate A3 is connected to the control terminal of the third selection transistor S3. The first terminal of the first selection transistor S1 is respectively connected to the second terminal of the first micro LED L1 and the first terminal of the second micro LED L2. The first terminal of the second selection transistor S2 is respectively connected to the second terminal of the second micro LED L2 and the first terminal of the third micro LED L3. The first terminal of the third selection transistor S3 is respectively connected to the second terminal of the third micro LED L3 and the first terminal of the fourth micro LED L4. The second terminals of the first selection transistor S1, the second selection transistor S2 and the third selection transistor S3 are respectively connected to the second voltage Vss. As shown in FIG. 6A, one terminal of the capacitor C1 is connected to the first input terminal of the first AND gate A1, and the other terminal of the capacitor C1 is grounded. One terminal of the capacitor C2 is connected to the second input terminal of the second AND gate A2, and the other terminal of the capacitor C2 is grounded. The capacitors C1 and C2 are configured to store (record) the inputted first selection signal SS1 and the inputted second selection signal SS2, respectively.

Therefore, in the pixel Pe of this embodiment, the number and the brightness of the micro LEDs in the light-emitting unit 23 to be turned on can be controlled based on the data signal Dj transmitted by the switch unit 21 (the switch transistor T1), the first selection signal SS1 and the second selection signal SS2. Specifically, as shown in FIG. 6B, when the first selection signal SS1 is "1" and the second selection signal SS2 is "0", the output of the first AND gate A1 is "1" while the outputs of the second AND gate A2 and the third AND gate A3 are "0", so that the first selection transistor S1 is conducted and the second selection transistor S2 and the third selection transistor S3 are not conducted, thereby turning on the first micro LED L1.

When the first selection signal SS1 is "0" and the second selection signal SS2 is "1", the output of the first AND gate A1 is "0", the output of the second AND gate A2 is "1", and the output of the third AND gate A3 is "0", so that the first selection transistor S1 is not conducted, the second selection transistor S2 is conducted, and the third selection transistor S3 is not conducted, thereby turning on two micro LEDs (the first micro LED L1 and the second micro LED L2).

When the first selection signal SS1 is "1" and the second selection signal SS2 is "1", the output of the first AND gate A1 is "0", the output of the second AND gate A2 is "0", and the output of the third AND gate A3 is "1", so that the first selection transistor S1 is not conducted, the second selection transistor S2 is not conducted, and the third selection transistor S3 is conducted, thereby turning on three micro LEDs (the first micro LED L1, the second micro LED L2 and the third micro LED L3).

When the first selection signal SS1 is "0" and the second selection signal SS2 is "0", the output of the first AND gate A1 is "0", the output of the second AND gate A2 is "0", and the output of the third AND gate A3 is "0", so that the first selection transistor S1 is not conducted, the second selection transistor S2 is not conducted, and the third selection transistor S3 is not conducted, thereby turning on four micro LEDs (the first micro LED L1, the second micro LED L2, the third micro LED L3 and the fourth micro LED L4).

The other technical features and descriptions of the pixels Pa, Pb, Pc, Pd and Pe can be referred to the same components of the above-mentioned pixel P, so the detailed descriptions thereof will be omitted.

In each of the aforementioned five embodiments, the number and the brightness of the micro LEDs in the light-emitting unit 23 to be turned on can be controlled by the selection unit 222 and the driving unit 221 according to the data signal Dj transmitted by the switch unit 21 and the selection signal received by the selection unit 222, thereby achieving the following technical effects of (1) increasing the power utilization rate of the micro LEDs in pixels, thereby improving the luminous efficiency (cd/W) of the micro LEDs of the display panel, (2) improving luminous brightness, and (3) implementing more display gray levels, thereby enriching the color expression of the displayed images and increasing the color layers of the displayed images.

In some embodiments, the larger the number and brightness of the micro LEDs connected in series, the higher the gain of luminous efficiency. For example, if three or more than three red micro LEDs are connected in series, the luminous efficiency (cd/W) can be increased by 100%; if three or more than three green micro LEDs are connected in series, the luminous efficiency can be increased by 100%; and if three or more than three blue micro LEDs are connected in series, the luminous efficiency can be increased by 100%.

In summary, in the micro LED display panel and the pixel driving circuit thereof of this disclosure, the switch unit controls a data signal input according to a scan signal, the driving unit is electrically connected to the switch unit and the light-emitting unit and electrically connected to a first voltage, and the selection unit receives a selection signal, is electrically connected to a second voltage, and is electrically connected to the micro LEDs and the driving unit. A number and a brightness of the micro LEDs in the light-emitting unit to be turned on are controlled by the selection unit and the driving unit according to the selection signal and the data signal. Based on the above-mentioned circuit design, the present disclosure can achieve the following technical effects of (1) increasing the power utilization rate of the micro LEDs in pixels, thereby improving the luminous efficiency (cd/W) of the micro LEDs of the display panel, (2) improving luminous brightness, and (3) implementing more display gray levels, thereby enriching the color expression of the displayed images and increasing the color layers of the displayed images.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A pixel driving circuit is used for driving a light-emitting unit, wherein the light-emitting unit comprises a plurality of micro LEDs connected in series, the pixel driving circuit comprising:
   a switch unit controlling a data signal input according to a scan signal;
   a driving unit electrically connected to the switch unit and the light-emitting unit, and electrically connected to a first voltage; and
   a selection unit receiving a selection signal input from a circuit other than the pixel driving circuit and electrically connected to a second voltage, wherein the selection unit is electrically connected to the micro LEDs and the driving unit, and the selection unit comprises a first selection transistor and a second selection transistor;
   wherein, a number and a brightness of the micro LEDs in the light-emitting unit to be turned on are controlled by the selection unit and the driving unit according to the selection signal and the data signal.

2. The pixel driving circuit of claim 1, wherein the switch unit comprises a switch transistor, the driving unit comprises a driving transistor, each of the switch transistor and the driving transistor comprises a control terminal, a first terminal and a second terminal, the scan signal is inputted to the control terminal of the switch transistor, the data signal is inputted to the first terminal of the switch transistor, the second terminal of the switch transistor is connected to the control terminal of the driving transistor, the first terminal of the driving transistor is connected to the first voltage, and the second terminal of the driving transistor is connected to a first terminal of one of the micro LEDs.

3. The pixel driving circuit of claim 2, wherein the light-emitting unit comprises a first micro LED and a second micro LED, each of the first selection transistor and the second selection transistor comprises a control terminal, a first terminal and a second terminal, the selection signal comprises a first selection signal and a second selection signal, the first selection signal is inputted to the control terminal of the first selection transistor, the first terminals of the first selection transistor and the second selection transistor are connected to each other and connected to a second terminal of the first micro LED, the second terminal of the first selection transistor is connected to a first terminal of the second micro LED, the second selection signal is inputted to the control terminal of the second selection transistor, and the second terminal of the second selection transistor is electrically connected to the second voltage.

4. The pixel driving circuit of claim 3, wherein the light-emitting unit further comprises a third micro LED, the second micro LED and the third micro LED are directly connected in series, and the first micro LED is connected to the second micro LED in series via the first selection transistor.

5. The pixel driving circuit of claim 4, wherein the first micro LED and the second micro LED are connected respectively to the first terminal and the second terminal of the first selection transistor.

6. The pixel driving circuit of claim 3, wherein the light-emitting unit further comprises a third micro LED, the selection unit further comprises a third selection transistor and a fourth selection transistor, each of the third selection transistor and the fourth selection transistor comprises a control terminal, a first terminal and a second terminal, the selection signal further comprises a third selection signal and a fourth selection signal, the third selection signal is inputted to the control terminal of the third selection transistor, the first terminal of the third selection transistor is connected to a second terminal of the second micro LED and the first terminal of the fourth selection transistor, the second terminal of the third selection transistor is connected to a first terminal of the third micro LED, the fourth selection signal is inputted to the control terminal of the fourth selection transistor, and the second terminal of the fourth selection transistor is electrically connected to the second voltage.

7. The pixel driving circuit of claim 2, wherein the light-emitting unit comprises a first micro LED and a second micro LED, the selection unit further comprises a third selection transistor and an XNOR gate, each of the first selection transistor, the second selection transistor and the third selection transistor comprises a control terminal, a first terminal and a second terminal, the selection signal comprises a first selection signal and a second selection signal, the first selection signal is inputted to the control terminal of the first selection transistor and a first input terminal of the XNOR gate, the first terminal of the first selection transistor is connected to the second terminal of the first micro LED and the first terminal of the third selection transistor, the second terminal of the first selection transistor is connected to the second voltage, the second selection signal is inputted to a second input terminal of the XNOR gate, an output terminal of the XNOR gate is connected to the first terminal of the second selection transistor, the control terminal of the second selection transistor receives the scan signal, the second terminal of the second selection transistor is connected to the control terminal of the third selection transistor, and the second terminal of the third selection transistor is connected to the first terminal of the second micro LED.

8. The pixel driving circuit of claim 2, wherein the light-emitting unit comprises a first micro LED, a second micro LED, a third micro LED and a fourth micro LED, which are directly connected in series, the selection unit further comprises a third selection transistor, a first AND gate, a second AND gate and a third AND gate, each of the first selection transistor, the second selection transistor and the third selection transistor comprises a control terminal, a first terminal and a second terminal, the selection signal comprises a first selection signal and a second selection signal, the first selection signal is inputted to a first input terminal of the first AND gate and a first input terminal of the third AND gate, a reverse signal of the first selection signal is inputted to a first input terminal of the second AND gate, the second selection signal is inputted to a second input terminal of the second AND gate and a second input terminal of the third AND gate, a reverse signal of the second selection signal is inputted to a second input terminal of the first AND gate, an output terminal of the first AND gate is connected to the control terminal of the first selection transistor, an output terminal of the second AND gate is connected to the control terminal of the second selection transistor, an output terminal of the third AND gate is connected to the control terminal of the third selection transistor, the first terminal of the first selection transistor is connected to a second terminal of the first micro LED and a first terminal of the second micro LED, the first terminal of the second selection transistor is connected to a second terminal of the second micro LED and a first terminal of the third micro LED, the first terminal of the third selection transistor is connected to a second terminal of the third micro LED and a first terminal of the fourth micro LED, and the second terminals of the first selection transistor, the second selection transistor and the third selection transistor are connected to the second voltage.

9. The pixel driving circuit of claim 2, wherein the light-emitting unit comprises at least three micro LEDs, which are directly connected in series, the selection unit further comprises a plurality of output terminals, each of the output terminals is disposed between adjacent two of the connected micro LEDs, and is connected a first terminal of one of the micro LEDs and a second terminal of another one of the micro LEDs, and the selection unit further comprises a logic gate, the first selection transistor or the second selection transistor is a field-effect transistor.

10. The pixel driving circuit of claim 1, wherein a part of the selection unit is connected between the micro LEDs in series.

11. A micro LED display panel, comprising:
a plurality of light-emitting units arranged in array, wherein each of the light-emitting units comprises a plurality of micro LEDs, which are connected in series; and
a driving substrate comprising a plurality of pixel driving circuits, wherein the light-emitting units are disposed on the driving substrate and electrically connected to the pixel driving circuits, respectively, to display an image;
wherein, one of the pixel driving circuits comprises:
a switch unit controlling a data signal input according to a scan signal;
a driving unit electrically connected to the switch unit and the light-emitting unit, and electrically connected to a first voltage; and
a selection unit receiving a selection signal input from a circuit other than the pixel driving circuit and electrically connected to a second voltage, wherein the selection unit is electrically connected to the micro LEDs and the driving unit, and the selection unit comprises a first selection transistor and a second selection transistor; and
wherein, a number and a brightness of the micro LEDs in the light-emitting unit to be turned on are controlled by the selection unit and the driving unit according to the selection signal and the data signal.

12. The micro LED display panel of claim 11, wherein the micro LEDs in any one of the light-emitting units emit lights of the same color.

13. The micro LED display panel of claim 11, wherein the switch unit comprises a switch transistor, the driving unit comprises a driving transistor, each of the switch transistor and the driving transistor comprises a control terminal, a first terminal and a second terminal, the scan signal is inputted to the control terminal of the switch transistor, the data signal is inputted to the first terminal of the switch transistor, the second terminal of the switch transistor is connected to the control terminal of the driving transistor, the first terminal of the driving transistor is connected to the first voltage, and the second terminal of the driving transistor is connected to a first terminal of one of the micro LEDs.

14. The micro LED display panel of claim 13, wherein the light-emitting unit comprises a first micro LED and a second micro LED, each of the first selection transistor and the second selection transistor comprises a control terminal, a first terminal and a second terminal, the selection signal comprises a first selection signal and a second selection signal, the first selection signal is inputted to the control terminal of the first selection transistor, the first terminals of the first selection transistor and the second selection transistor are connected to each other and connected to a second terminal of the first micro LED, the second terminal of the first selection transistor is connected to a first terminal of the second micro LED, the second selection signal is inputted to the control terminal of the second selection transistor, and the second terminal of the second selection transistor is electrically connected to the second voltage.

15. The micro LED display panel of claim 14, wherein the light-emitting unit further comprises a third micro LED and a fourth micro LED, the second micro LED, the third micro LED and the fourth micro LED are directly connected in series, and the first micro LED is connected to the second micro LED in series via the first selection transistor.

16. The micro LED display panel of claim 14, wherein the light-emitting unit further comprises a third micro LED, the selection unit further comprises a third selection transistor and a fourth selection transistor, each of the third selection transistor and the fourth selection transistor comprises a control terminal, a first terminal and a second terminal, the selection signal further comprises a third selection signal and a fourth selection signal, the third selection signal is inputted to the control terminal of the third selection transistor, the first terminal of the third selection transistor is connected to a second terminal of the second micro LED and the first terminal of the fourth selection transistor, the second terminal of the third selection transistor is connected to a first terminal of the third micro LED, the fourth selection signal is inputted to the control terminal of the fourth selection transistor, and the second terminal of the fourth selection transistor is electrically connected to the second voltage.

17. The micro LED display panel of claim 13, wherein the light-emitting unit comprises a first micro LED, a second micro LED, a third micro LED and a fourth micro LED, the selection unit further comprises a third selection transistor, a first AND gate, a second AND gate and a third AND gate, each of the first selection transistor, the second selection transistor and the third selection transistor comprises a control terminal, a first terminal and a second terminal, the selection signal comprises a first selection signal and a second selection signal, the first selection signal is inputted to a first input terminal of the first AND gate and a first input terminal of the third AND gate, a reverse signal of the first selection signal is inputted to a first input terminal of the second AND gate, the second selection signal is inputted to a second input terminal of the second AND gate and a second input terminal of the third AND gate, a reverse signal of the second selection signal is inputted to a second input terminal of the first AND gate, an output terminal of the first AND gate is connected to the control terminal of the first selection transistor, an output terminal of the second AND gate is connected to the control terminal of the second selection transistor, an output terminal of the third AND gate is connected to the control terminal of the third selection transistor, the first terminal of the first selection transistor is connected to a second terminal of the first micro LED and a first terminal of the second micro LED, the first terminal of the second selection transistor is connected to a second terminal of the second micro LED and a first terminal of the third micro LED, the first terminal of the third selection transistor is connected to a second terminal of the third micro LED and a first terminal of the fourth micro LED, and the second terminals of the first selection transistor, the second selection transistor and the third selection transistor are connected to the second voltage.

18. The micro LED display panel of claim 13, wherein the light-emitting unit comprises at least three micro LEDs, which are directly connected in series, the selection unit comprises a plurality of output terminals, each of the output terminals is disposed between adjacent two of the connected micro LEDs, and is connected a first terminal of one of the micro LEDs and a second terminal of another one of the micro LEDs, and the selection unit comprises a logic gate, the first selection transistor or the second selection transistor is a field-effect transistor.

19. The micro LED display panel of claim 11, wherein a part of the selection unit is connected between the micro LEDs in series.

* * * * *